United States Patent
Um et al.

(10) Patent No.: US 7,456,431 B2
(45) Date of Patent: Nov. 25, 2008

(54) ORGANIC LIGHT EMITTING DISPLAY

(75) Inventors: Yoon-Sung Um, Yongin-si (KR);
Beohm-Rock Choi, Seoul (KR); Jae-Jin Lyu, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 220 days.

(21) Appl. No.: 11/094,146

(22) Filed: Mar. 31, 2005

(65) Prior Publication Data

US 2005/0218409 A1    Oct. 6, 2005

(30) Foreign Application Priority Data

Apr. 2, 2004    (KR) .................. 10-2004-0022893

(51) Int. Cl.
*H01L 29/04* (2006.01)

(52) U.S. Cl. .......................... 257/72; 257/66

(58) Field of Classification Search ............. 257/72, 257/59–63, 79–88; 313/504, 506
See application file for complete search history.

(56) References Cited

U.S. PATENT DOCUMENTS

| | | | | |
|---|---|---|---|---|
| 6,426,787 B1 * | 7/2002 | Satake et al. | ................ | 349/138 |
| 6,636,284 B2 * | 10/2003 | Sato | ................ | 349/110 |
| 6,946,791 B2 * | 9/2005 | Choi et al. | ................ | 313/506 |
| 7,034,453 B2 * | 4/2006 | Kai et al. | ................ | 313/504 |
| 2001/0017517 A1 * | 8/2001 | Yamazaki | ................ | 313/504 |
| 2003/0080338 A1 * | 5/2003 | Yamazaki et al. | ................ | 257/59 |

* cited by examiner

*Primary Examiner*—Cuong Q Nguyen
(74) *Attorney, Agent, or Firm*—Cantor Colburn LLP

(57) ABSTRACT

An organic light emitting display that includes a pixel electrode and an organic light emitting member formed on the pixel electrode. The organic light emitting member has an inclined surface, and a common electrode is formed on the light emitting member.

32 Claims, 4 Drawing Sheets

ORGANIC LIGHT EMITTING DISPLAY

CROSS REFERENCE TO RELATED APPLICATION

This application claims priority to and the benefit of Korean Patent Application No. 10-2004-0022893 filed on Apr. 2, 2004, which is hereby incorporated by reference for all purposes as if fully set forth herein.

BACKGROUND OF THE INVENTION

1. Field of the Invention

The present invention relates to an organic light emitting display.

2. Discussion of the Background

An organic light emitting display (OLED) is a self emissive display device, which displays images by exciting an emissive organic material to emit light. The OLED includes an anode (hole injection electrode), a cathode (electron injection electrode), and an organic light emission layer interposed there between. When the holes and the electrons are injected into the light emission layer, they recombine to form exitons, which emit light when they transition from an excited state to a ground state. The light emission layer may further include an electron transport layer (ETL) and a hole transport layer (HTL) as well as an electron injecting layer (EIL) and a hole injecting layer (HIL) for enhancing the light emission. Each pixel of the OLED includes two thin film transistors (TFTs), i.e., a switching TFT and a driving TFT. The current for light emission is driven by the driving TFT and the amount of the current driven by the driving TFT is controlled by the data signals from the switching TFT.

A plurality of pixels of the OLED, each including an anode, a cathode, and a light emission layer, are arranged in a matrix and driven in passive matrix (or simple matrix) addressing or active matrix addressing.

The passive matrix type OLED includes a plurality of anode lines, a plurality of cathode lines intersecting the anode lines, and a plurality of pixels, each including a light emission layer. The selection of one of the anode lines and one of the cathode lines cause light emission of a pixel located at the intersection of the selected signal lines.

The active matrix type OLED includes a plurality of pixels, each including a switching transistor, a driving transistor, and a storage capacitor, as well as an anode, a cathode, and a light emission layer. The OLED further includes a plurality of gate lines transmitting gate signals and a plurality of data lines transmitting data voltages. The switching transistor is connected to one of the gate lines and one of the data lines and transmits the data voltage from the data line in response to the gate signal. The driving transistor receives the data voltage from the switching transistor and drives a current having a magnitude determined depending on the difference between the data voltage and a predetermined voltage, such as a supply voltage. The current from the driving transistor enters the light emission layer to cause light emission having an intensity depending on the current. The storage capacitor is connected between the data voltage and the supply voltage to maintain their voltage difference. The gray scaling of the active matrix type OLED is accomplished by controlling the data voltages to adjust the current driven by the driving transistor. The color representation of the OLED is obtained by providing red, green and blue light emission layers.

The light emission of the organic light emission layer is generated in a region having a thickness of several nanometers to dozens of nanometers. Since the luminance is proportional to the area of the light emission layer, it is important to secure a high aperture ratio for increasing the luminance level.

However, even after obtaining a high aperture ratio, increasing the luminance level is limited due to the reflection of light at the surface of the light emission layer, which escapes through lateral surfaces.

SUMMARY OF THE INVENTION

According to an embodiment of the present invention, there is provided an organic light emitting display that includes a pixel electrode, an organic light emitting member formed on the pixel electrode and having an inclined surface, and a common electrode formed on the organic light emitting member.

According to another embodiment of the invention, there is provided a light emitting member provided in an organic light emitting display, including a horizontal surface portion, and a vertical surface portion having a surface that is angled at approximately 80-100° with respect to the horizontal surface portion.

According to another embodiment of the invention, there is provided an organic light emitting display, including a pixel electrode, an organic light emitting member formed on the pixel electrode, the organic light emitting member having an angled surface, a common electrode formed on the organic light emitting member, an insulating substrate; first and second semiconductors formed on the insulating substrate, and a passivation layer that is formed on the first and the second semiconductors, the passivation layer having an angled surface forming the angled surface of the light emitting member, wherein the angled surface of the organic light emitting member and the angled surface of the passivation layer are both angled at approximately 80-100° with respect to the insulating substrate.

Additional aspects and/or advantages of the invention will be set forth in part in the description which follows and, in part, will be obvious from the description, or may be learned by practice of the invention.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF EMBODIMENTS

Figure 1:
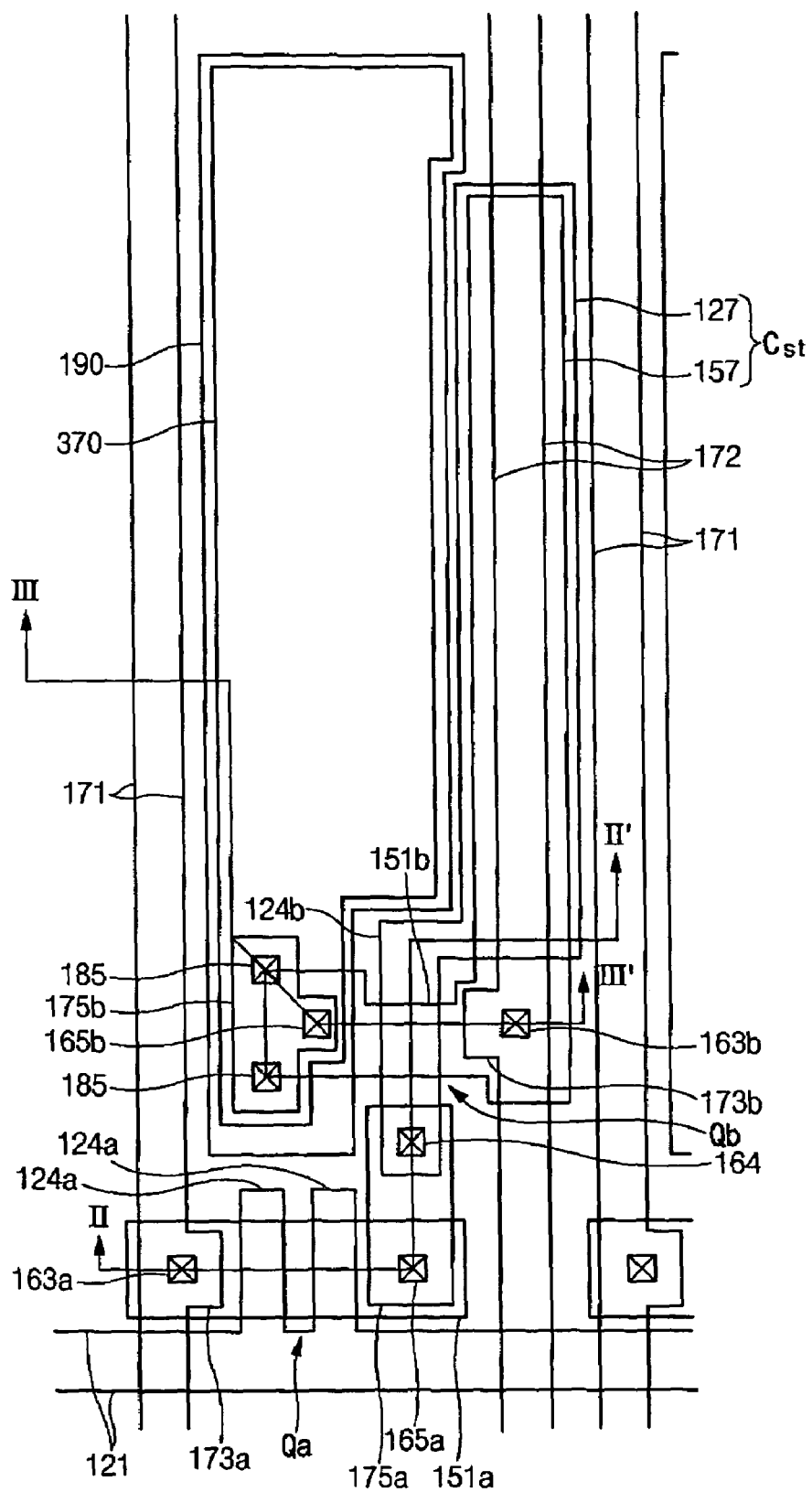
FIG. 1 is a layout view of an organic light emitting diode according to an embodiment of the invention.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films, panels, regions, etc. are not drawn to scale, e.g., exaggerated for clarity. Like numerals refer to like elements throughout. It will be understood that when an element such as, for example, a layer, film, region or substrate is referred to as being "on" another element, such element may be directly on the other element or intervening elements may also be present. In contrast, when an element is referred to as being "directly on" another element, no intervening elements are present.

Figure 2:
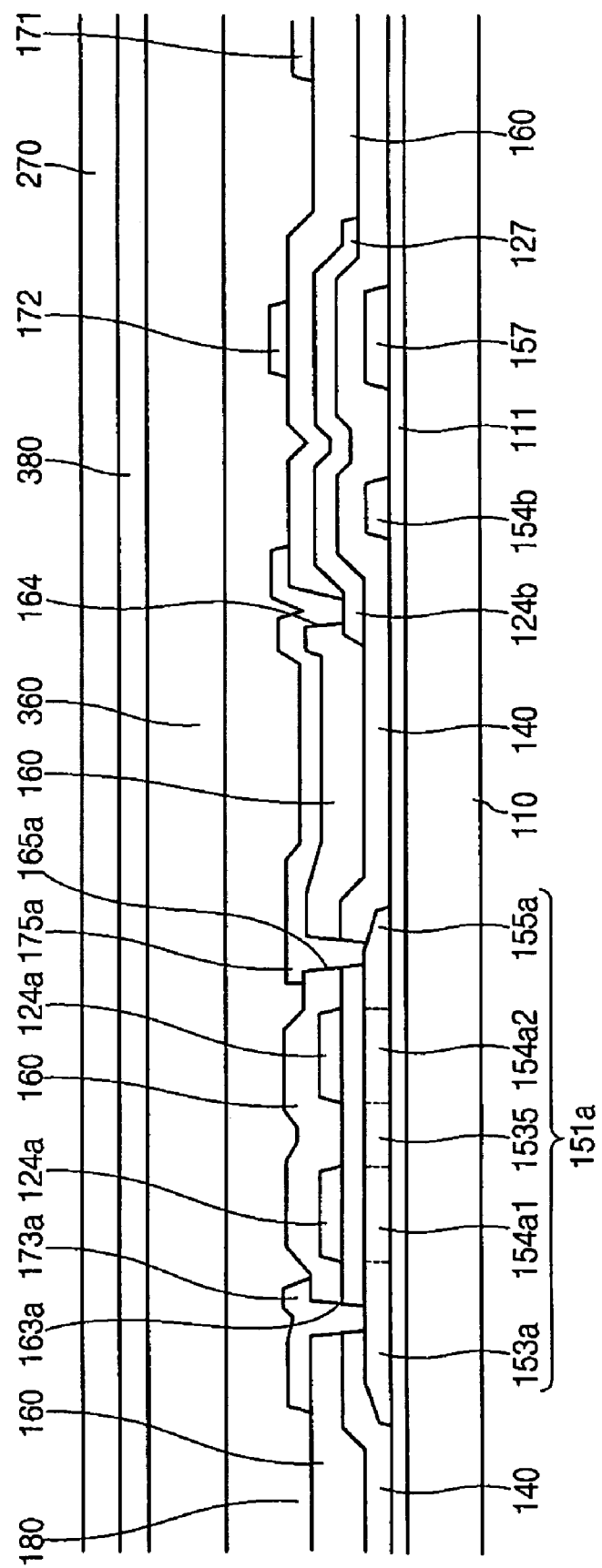
FIG. 2 is a sectional view of the organic light emitting diode shown in FIG. 1 along the line II-II.
Figure 3:
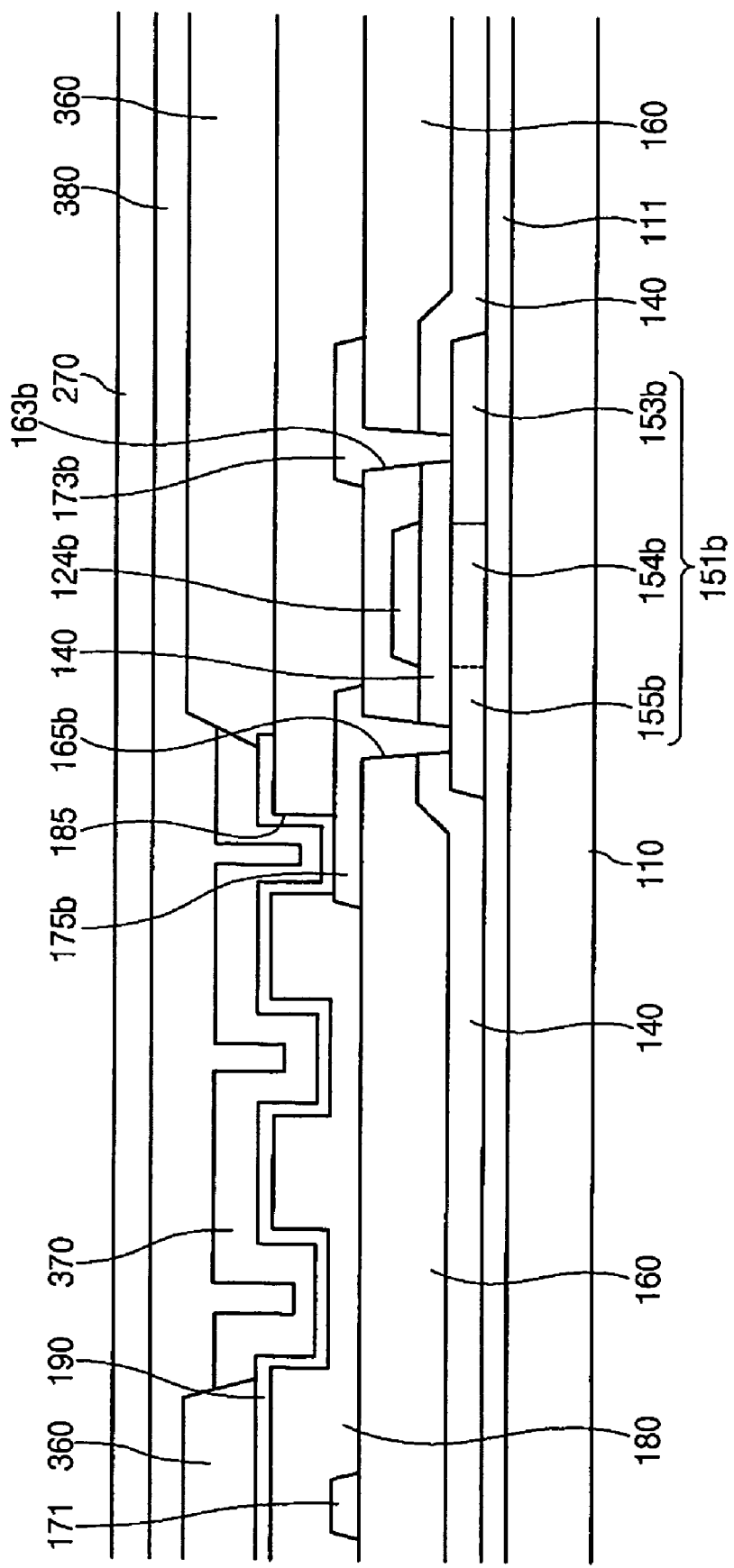
FIG. 3 is a sectional view of the thin film transistor array panel shown in FIG. 1 along the line III-III.

A TFT array panel for OLED according to an embodiment of the invention is described with reference to FIG. 1, FIG. 2, and FIG. 3. FIG. 1 is a layout view of a TFT array panel for an OLED according to an embodiment of the invention, FIG. 2 is a sectional view of the TFT array panel shown in FIG. 1 taken along the line II-II', and FIG. 3 is a sectional view of the TFT array panel shown in FIG. 1 taken along the line III-III'.

A blocking film 111, which may be made of silicon oxide or silicon nitride is formed on an insulating substrate 110, which may be made of transparent glass. The blocking film 111 may have a dual-layered structure.

A plurality of semiconductor islands 151a and 151b, which may be made of polysilicon, are formed on the blocking film 111. Each of the semiconductor islands 151a and 151b includes a plurality of extrinsic regions including N type or P type conductive impurity and at least one intrinsic region having substantially no conductive impurity.

Regarding a semiconductor island 151a for a switching TFT Qa, the extrinsic regions include a first source region 153a, an intermediate region 153S, and a first drain region 155a, which are doped with N type impurity and separated from one another. The intrinsic regions of the semiconductor island 151a include, for example, a pair of (first) channel regions 154a1 and 154a2 provided or sandwiched between the extrinsic regions 153a, 153S and 155a.

Regarding a semiconductor island 151b for a driving TFT Qb, the extrinsic regions include a second source region 153b and a second drain region 155b, each of which are doped with P type impurity and separated from one another. The intrinsic region of the semiconductor island 151b includes a channel region 154b provided or sandwiched between the second source region 153b and the second drain region 155b. The second source region 153b extends to form a storage region 157.

The extrinsic regions may further include lightly doped regions (not shown) provided between the channel regions 154a1, 154a2 and 154b and the source, drain, and intermediate regions 153a, 153b, 155a, 155b, 153S. The lightly doped regions may be substituted with offset regions that include substantially no impurity.

In another embodiment of the invention, the extrinsic regions 153a and 155a of the first semiconductor islands 151a are doped with P type impurity, while the extrinsic regions 153b and 155b of the second semiconductor islands 151b are doped with N type impurity, depending on driving conditions. The conductive impurity includes P type impurity such as, for example, boron (B) and gallium (Ga), and N type impurity, such as, for example, phosphorous (P) and arsenic (As).

A gate insulating layer 140, which may be made of silicon oxide or silicon nitride, is formed on the semiconductor islands 151a and 151b and on the blocking film 111.

A plurality of gate conductors including a plurality of gate lines 121 including a plurality of pairs of first gate electrodes 124a and a plurality of second gate electrodes 124b are formed on the gate insulating layer 140. For example, the plurality of first gate electrodes 124a are grouped in pairs of first gate electrodes 124a.

The gate lines 121 for transmitting gate signals extend substantially in a transverse or crosswise direction. Each pair of first gate electrodes 124a extend from the gate line 121 and intersect the first semiconductor islands 151a such that each pair of first gate electrodes 124a overlap the pair of the first channel regions 154a. For example, each pair of first gate electrodes 124a protrude upward from the gate line 12. Each gate line 121 may include an expanded end portion having an area sufficient for contact with another layer and/or or an external driving circuit. The gate lines 121 may be directly connected to a gate driving circuit for generating the gate signals, which may be integrated on the substrate 110.

The second gate electrodes 124b are separated from the gate lines 121 and intersect the second semiconductor islands 151b such that the second gate electrodes 124b overlap the second channel regions 154b. The second gate electrodes 124b extend to form storage electrodes 127 overlapping the storage electrode regions 157 of the second semiconductor islands 151b to form storage capacitors Cst.

The gate conductors 121 and 124b may be made of low resistivity material including Al type metal such as, for example, Al and Al alloy (e.g. Al—Nd), Ag type metal, such as, for example, Ag and Ag alloy, and Cu type metal such, for example, as Cu and Cu alloy. The gate conductors 121 and 124b may have a multi-layered structure including two films having different physical characteristics. One of the two films may be made of low resistivity metal including Al type metal, Ag type metal, and Cu type metal for reducing signal delay and/or voltage drop in the gate conductors 121 and 124b. The other film may be made of material such as, for example, Cr, Mo and Mo alloy, Ta or Ti, which has good physical, chemical, and electrical contact characteristics with other materials such as indium tin oxide (ITO) or indium zinc oxide (IZO). The two types of films in combination in the multi-layered structure may be, for example, a lower Cr film and an upper Al—Nd alloy film, and/or a lower Al film and an upper Mo film.

The lateral sides of the gate conductors 121 and 124b are inclined relative to a surface of the substrate 110, and the inclination angle thereof ranges approximately 30-80 degrees.

An interlayer insulating film 160 is formed on the gate conductors 121 and 124b. The interlayer insulating layer 160 may be made of, for example, photosensitive organic material having a good flatness characteristic, low dielectric insulating material such as a-Si:C:O and a-Si:O:F formed by plasma enhanced chemical vapor deposition (PECVD), or inorganic material such as silicon nitride and silicon oxide.

The interlayer insulating layer 160 has a plurality of contact holes 164 exposing the second gate electrodes 124b. The interlayer insulating layer 160 and the gate insulating layer 140 also have a plurality of contact holes 163a, 163b, 165a and 165b exposing the source regions 153a and 153b and the drain regions 155a and 155b, respectively.

A plurality of data conductors including a plurality of data lines 171, a plurality of voltage transmission lines 172, and a plurality of first and second drain electrodes 175a and 175b are formed on the interlayer insulating film 160. The data lines 171 for transmitting data signals extend substantially in the longitudinal direction and intersect the gate lines 121. Each data line 171 includes a plurality of first source electrodes 173a connected to the first source regions 153a through the contact holes 163a. Each data line 171 may include an expanded end portion having an area sufficient for contact with another layer and/or an external driving circuit. The data lines 171 may be directly connected to a data driving circuit for generating the gate signals, which may be integrated on the substrate 110.

The voltage transmission lines 172 for transmitting driving voltages for the driving TFT Qb extend substantially in the longitudinal direction and intersect the gate lines 121. Each voltage transmission line 172 includes a plurality of second source electrodes 173b connected to the second source regions 153b through the contact holes 163b. The voltage transmission lines 171 may be connected to each other.

The first drain electrodes 175a are located separate or apart from the data lines 171 and the voltage transmission lines 172, and the first drain electrodes 175a are connected with the first drain regions 155a through the contact holes 165a and are connected with the second gate electrodes 124b through the contact hole 164.

The second drain electrodes 175b are located separate from the data lines 171 and the voltage transmission lines 172. The second drain electrodes 175b are connected with the second drain regions 155b through the contact holes 165b.

The data conductors 171, 172, 175a, and 175b may be made of refractory metal including, for example, Cr, Mo, Ti, Ta, or similar alloys thereof. The data conductors 171, 172, 175a, and 175b may have a multi-layered structure and the multi-layered structure may include a low resistivity film and a good contact film. According to an embodiment of the invention, the multi-layered structure may be a double-layered structure comprising, for example, a lower Cr film and an upper Al (alloy) film, a double-layered structure of a lower Mo (alloy) film and an upper Al (alloy) film, or a triple-layered structure of a lower Mo film, an intermediate Al film, and an upper Mo film.

The data conductors 171, 172, 175a and 175b have an inclined edge profile and the inclination angles thereof range from a approximately 30-80 degrees.

A passivation layer 180 is formed on the data conductors 171, 172, 175a and 175b. According to an embodiment of the invention, the passivation layer 180 is may be made of photosensitive organic material having a good flatness characteristic, low dielectric insulating material such as a-Si:C:O and a-Si:O:F formed by PECVD, or inorganic material such as silicon nitride and silicon oxide.

The passivation layer 180 has a plurality of contact holes 185 exposing the second drain electrodes 175b. The passivation layer 180 may further have a plurality of contact holes (not shown) exposing end portions of the data lines 171. The passivation layer 180 and the interlayer insulating layer 160 may have a plurality of contact holes (not shown) exposing end portions of the gate lines 121.

The passivation layer 180 has an uneven surface that has prominences and/or depressions, each of the prominances and depressions having lateral surfaces substantially vertical to the surface of the substrate 110. According to an embodiment of the invention, the lateral surfaces form approximately an 80-100° angle with respect to the substrate 110, preferably the lateral surfaces form approximately a 90° angle.

The prominences and the depressions may extend linearally and the prominences may further have a lattice pattern. The uneven surface area may cover the entire area of the substrate 110 or only partly cover the substrate 110.

A plurality of pixel electrodes 190 are formed on the passivation layer 180. The pixel electrodes 190 are connected with the second drain electrodes 175b through the contact holes 185. The pixel electrodes 190 may be made of at least one of reflective opaque material, such as, for example, Al or Ag alloy. According to another embodiment of the invention, the pixel electrode 190 may be made of transparent conductor material such as, for example, ITO or IZO, and opaque reflective conductor such as, for example, Al, Ag, Ca, Ba and Mg. The pixel electrode 190 may be incorporated with the second drain electrode 175b to reduce the manufacturing cost.

A plurality of contact assistants or connecting members (not shown) may be also formed on the passivation layer 180 such that they are connected to the exposed end portions of the gate lines 121 or the data lines 171.

A partition 360 for separating pixels of the TFT array panel is formed on the passivation layer 180 and the pixel electrodes 190. The partition 360 surrounds the pixel electrodes 190 and defines openings to be filled with organic light emitting material. The partition 360 may be made of organic insulating material. The partition 360 may also be made of a photosensitive material having black pigment, which is exposed to light and developed, such that the partition 360 functions as a light blocking member and a manufacturing method thereof is simplified.

A plurality of light emitting members 370 are formed on the pixel electrodes 190 and provided in the openings defined by the partition 360. The light emitting members 370 may be made of organic material emitting primary-color lights such as red, green and blue lights. The red, green and blue light emitting members 370 are periodically arranged according to predetermined conditions.

The light emitting members 370 are curved along the uneven surface of the passivation layer 180. The light emitting members 370 have surfaces that are substantially vertical to the surface of the substrate 110. According to an embodiment of the invention, the vertical surfaces form an angle of approximately 80-100°, more preferably, the vertical surfaces form an angle of approximately 90° with respect to the substrate 110.

This vertical profile of the surfaces of the light emitting members 370 improves the light efficiency by allowing for the reflected lights to be used in the display. The above-described feature will be described in more detail herein below with reference to FIG. 4.

Figure 4:
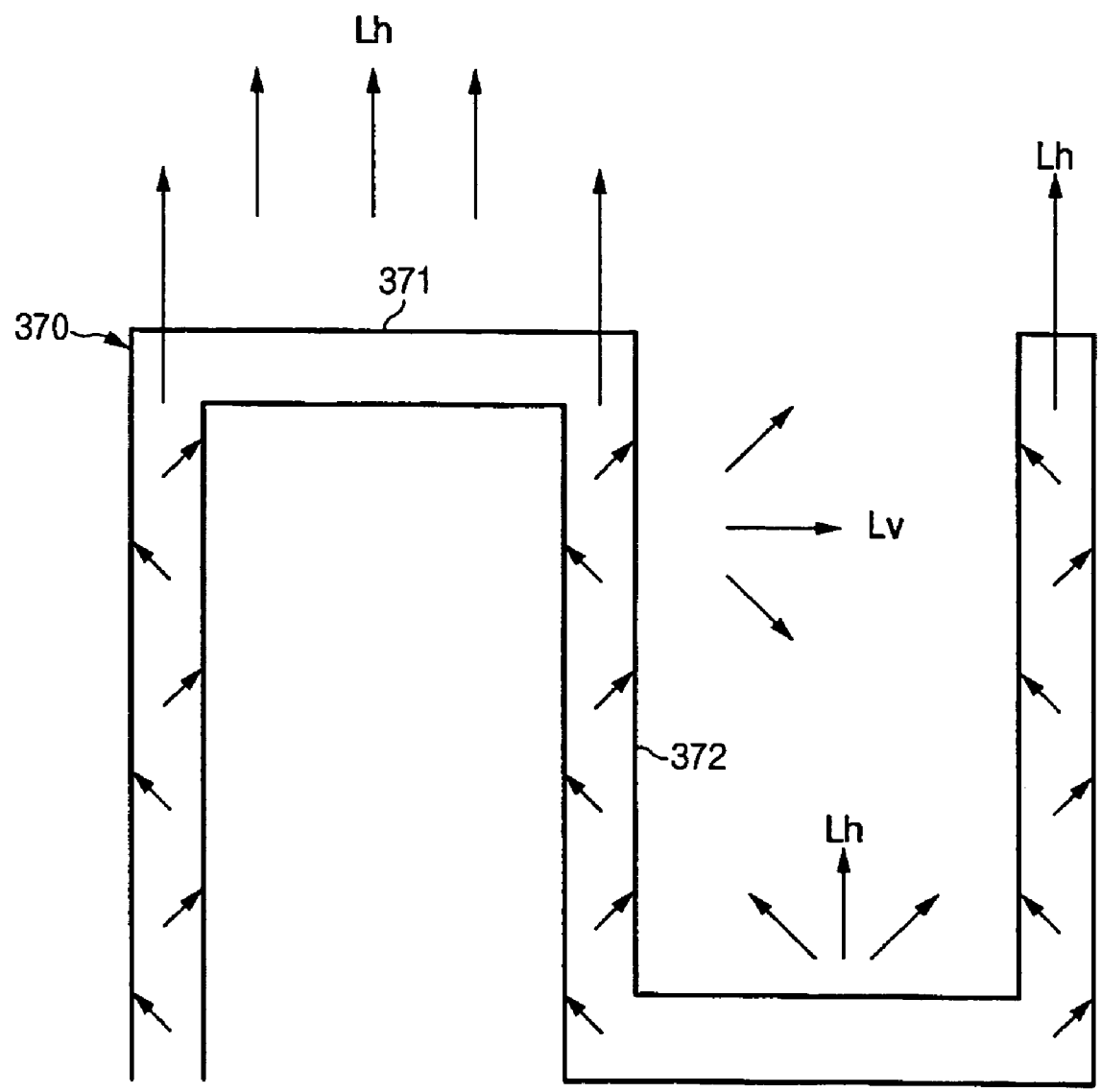
FIG. 4 illustrates a path of light reflected at the surfaces of the light emitting member shown in FIG. 3.

FIG. 4 illustrates a path of light reflected at the surfaces of the light emitting member shown in FIG. 3. Referring to FIG. 4, a light emitting member 370 has horizontal surfaces 371 and vertical surfaces 372. As such, the total light emitting area is increased as compared with a light emitting member having only a horizontal surface because the light Lv emitted from the vertical surfaces 372 as well as the light Lh emitted from the horizontal surfaces 371 both contribute to the display of images. When the inclination angles of the horizontal surfaces 371 and vertical surfaces 372 exceed approximately 80-100°, relative to a surface of the substrate 110 light emitted from the inclined surfaces is apt to be lost.

Referring again to FIG. 1, FIG. 2 and FIG. 3, a buffer layer 380 is formed on the light emitting members 370 and the partition 360. The buffer layer 380 may be omitted if the buffer layer 380 is not required.

A common electrode 270 supplied with a predetermined voltage, such as a common voltage, is formed on the buffer layer 380. The common electrode 270 may be made of a transparent conductive material such as, for example, ITO and IZO, or opaque metal such as, for example, Al, Ag, Ca, Ba and Mg.

An auxiliary electrode (not shown) made of low resistivity material may be provided to compensate the conductivity of the common electrode 270. The auxiliary electrode may be provided between the common electrode 270 and the buffer layer 380 or on the common electrode 270. Additionally, the auxiliary electrode may have a matrix form and be provided along the partition 360 such that the auxiliary electrode does not overlap the light emitting member 370.

In the above-described TFT array panel, a first semiconductor island 151 a, a first gate electrode 124a connected to the gate line 121, a first source electrode 173a connected to the data line 171, and a first drain electrode 175a form a switching TFT Qa. A second semiconductor island 151b, a second gate electrode 124b connected to the first drain electrode 175a, a second source electrode 173b connected to the voltage transmission line 172, and a second drain electrode 175b connected to a pixel electrode 190 form a driving TFT Qb. Further, a pixel electrode 190 and a common electrode 270 operate as an anode and a cathode, respectively. A storage region 157 connected to a first drain region 155a and a storage electrode 127 connected to a voltage transmission line 172 through a second source electrode 173b form a storage capacitor Cst.

The switching TFT Qa transmits data signals from the data line 171 to the driving TFT Qb in response to the gate signal from the gate line 121. Upon the receipt of the data signal, the driving TFT Qb generates a current having a magnitude according to the voltage difference between the second gate electrode 124b and the second source electrode 173b. The voltage difference is charged in the storage capacitor Cst and maintained after the switching TFT Qa is turned off.

The current driven by the driving TFT Qb enters into the light emitting member 370 through the pixel electrode 190 and reaches the common electrode 270. The current flowing in the light emitting member 370 indicates that positive charge carriers, such as holes, and negative charge carriers, such as electrons, are injected into the light emitting member 370 from the anode 190 and the cathode 270, respectively, and the positive charge carriers and negative charge carriers are drifted by an electric field generated by the voltage difference between the anode 190 and the cathode 270. The holes and the electrons in the light emitting member 370 meet each other and are recombined into excitons, which emit light with a predetermined wavelength. The intensity of the emitted light varies according to the current driven by the driving TFT Qb and flowing in the light emitting member 370.

The light emits from the display panel after passing through the common electrode 270 or the pixel electrode 190. A transparent common electrode 270 and an opaque pixel electrode 190 are applicable to a top emission type OLED, which displays an image on its top surface. A transparent pixel electrode 190 and an opaque common electrode 270 are applicable to a bottom emission type OLED, which displays an image on its bottom surface.

The semiconductor islands 151a and 151b may be made of amorphous silicon without impurity regions. When the semiconductor islands 151a and 151b are made of amorphous silicon without impurity regions, ohmic contacts preferably made of silicide or amorphous silicon heavily doped with N type impurity may be provided between the semiconductor islands 151a and 151b and the data conductors 171, 172, 175a and 175b.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display, comprising:
    a pixel electrode;
    an organic light emitting member formed on the pixel electrode, contacting the pixel electrode, and spaced apart from all edges of the pixel electrode; and
    a common electrode provided on the organic light emitting member,
    wherein the organic light emitting member comprises an angled surface portion disposed in a contact area where the organic light emitting member is in contact with the pixel electrode.

2. The organic light emitting display of claim 1, wherein the organic light emitting member has a top surface and a bottom surface disposed opposite the top surface and disposed proximately closer to the pixel electrode than the top surface, and
    wherein the top surface comprises the angled surface portion and the bottom surface comprises a portion that is disposed opposite the angled portion of the top surface and in contact with the pixel electrode.

3. The organic light emitting display of claim 1, wherein the angled surface portion is in contact with the pixel electrode.

4. The organic light emitting display of claim 1, wherein the organic light emitting member further comprises a horizontal surface portion making an angle of approximately 80 degrees to approximately 100 degrees with the angled surface portion.

5. The organic light emitting display of claim 1, further comprising a partition having an opening exposing the pixel electrode, wherein the organic light emitting member is provided in the opening.

6. The organic light emitting display of claim 5, wherein the partition covers the edges of the pixel electrode.

7. The organic light emitting display of claim 1, wherein a cross-section of the organic light emitting member has a shape of a rectangular-wave-like band.

8. The organic light emitting display of claim 7, wherein a cross-section of the pixel electrode has a shape following the cross-section of the organic light emitting member.

9. The organic light emitting display of claim 8, further comprising an insulating layer formed under the pixel electrode,
    wherein the insulating layer has a bottom surface and a top surface opposite the bottom surface and disposed proximately closer to the pixel electrode than the bottom surface, and
    wherein the top surface of the insulating layer comprises an angled portion forming the angled surface portion of the organic light emitting member.

10. The organic light emitting display of claim 9, wherein the insulating layer is in contact with the pixel electrode and spaced apart from the organic light emitting member.

11. The organic light emitting display of claim 9, wherein a portion of the bottom surface of the insulating layer disposed under the organic light emitting member is substantially flat.

12. An organic light emitting display, comprising:
    an insulating layer;
    a pixel electrode formed on the insulating layer and contacting the insulating layer;
    an organic light emitting member formed on the pixel electrode, contacting the pixel electrode, and spaced apart from the insulating layer; and
    a common electrode provided on the organic light emitting member,
    wherein the organic light emitting member comprises an angled surface portion disposed in a contact area where the organic light emitting member is in contact with the pixel electrode.

13. The organic light emitting display of claim 12, wherein the organic light emitting member has a top surface and a bottom surface disposed opposite the top surface and disposed proximately closer to the pixel electrode than the top surface, and wherein the top surface comprises the angled surface portion and the bottom surface comprises a portion that is disposed opposite the angled portion of the top surface and in contact with the pixel electrode.

14. The organic light emitting display of claim 12, wherein the angled surface portion is in contact with the pixel electrode.

15. The organic light emitting display of claim 12, wherein the organic light emitting member further comprises a horizontal surface portion making an angle of approximately 80 degrees to approximately 100 degrees with the angled surface portion.

16. The organic light emitting display of claim 15, further comprising a partition having an opening exposing the pixel electrode, wherein the organic light emitting member is provided in the opening.

17. The organic light emitting display of claim 16, wherein the partition covers the edges of the pixel electrode.

18. The organic light emitting display of claim 12, wherein a cross-section of the organic light emitting member has a shape of a rectangular-wave-like band.

19. The organic light emitting display of claim 18, wherein a cross-section of the pixel electrode has a shape following the cross-section of the organic light emitting member.

20. The organic light emitting display of claim 19, wherein the insulating layer has a bottom surface and a top surface opposite the bottom surface and disposed proximately closer to the pixel electrode than the bottom surface, and wherein the top surface of the insulating layer comprises an angled portion forming the angled surface portion of the organic light emitting member.

21. The organic light emitting display of claim 20, wherein a portion of the bottom surface of the insulating layer disposed under the organic light emitting member is substantially flat.

22. An organic light emitting display, comprising:
a pixel electrode;
an organic light emitting member formed on the pixel electrode; and
a common electrode provided on the organic light emitting member,
wherein the organic light emitting member has:
a top surface; and
a bottom surface opposite the top surface and disposed proximately closer to the pixel electrode than the top surface; and
a side surface connecting the top surface and the bottom surface;

wherein at least one of the top surface and the bottom surface comprises an angled portion, and an entire area of the bottom surface is in contact with the pixel electrode.

23. The organic light emitting display of claim 22, wherein at least one of the top surface and the bottom surface further comprises a horizontal portion making an angle of approximately 80 degrees to approximately 100 degrees with the angled portion.

24. The organic light emitting display of claim 22, further comprising a partition having an opening exposing the pixel electrode, wherein the organic light emitting member is provided in the opening and the side surface of the organic light emitting member is in contact with the partition.

25. The organic light emitting display of claim 22, wherein a cross-section of the organic light emitting member has a shape of a rectangular-wave-like band.

26. An organic light emitting display, comprising:
an insulating layer having an angled surface;
a pixel electrode formed on the insulating layer and comprising an angled portion following a profile of the angled surface of the insulating layer;
an organic light emitting member formed on the pixel electrode, the organic light emitting member comprising an angled portion following a profile of the angled portion of the pixel electrode; and
a common electrode formed on the organic light emitting member.

27. The organic light emitting display of claim 26, wherein the angled portion of the organic light emitting member is disposed in a contact area where the organic light emitting member is in contact with the pixel electrode.

28. The organic light emitting display of claim 27, wherein the organic light emitting member further comprises a horizontal portion making an angle of approximately 80 degrees to approximately 100 degrees with the angled portion of the organic light emitting member.

29. The organic light emitting display of claim 27, further comprising a partition having an opening exposing the pixel electrode, wherein the organic light emitting member is provided in the opening.

30. The organic light emitting display of claim 29, wherein the partition covers the edges of the pixel electrode.

31. The organic light emitting display of claim 27, wherein a cross-section of the organic light emitting member has a shape of a rectangular-wave-like band.

32. The organic light emitting display of claim 27, wherein a portion of a bottom surface of the insulating layer disposed under the organic light emitting member is substantially flat.

* * * * *